(12) United States Patent
Fillmore et al.

(10) Patent No.: US 9,362,237 B2
(45) Date of Patent: Jun. 7, 2016

(54) AIR BRIDGE STRUCTURE HAVING DIELECTRIC COATING

(71) Applicant: Raytheon Company, Waltham, MA (US)

(72) Inventors: Ward G. Fillmore, Hudson, MA (US); Paul J. Duval, Lexington, MA (US)

(73) Assignee: RAYTHEON COMPANY, Waltham, MA (US)

( * ) Notice: Subject to any disclaimer, the term of this patent is extended or adjusted under 35 U.S.C. 154(b) by 0 days.

(21) Appl. No.: 14/941,161

(22) Filed: Nov. 13, 2015

(65) Prior Publication Data

US 2016/0071809 A1    Mar. 10, 2016

Related U.S. Application Data

(62) Division of application No. 14/086,105, filed on Nov. 21, 2013, now Pat. No. 9,219,024.

(51) Int. Cl.
| | |
|---|---|
| H01L 23/482 | (2006.01) |
| H01L 21/764 | (2006.01) |
| H01L 23/00 | (2006.01) |
| H01L 21/768 | (2006.01) |
| H01L 23/66 | (2006.01) |

(52) U.S. Cl.
CPC .......... *H01L 23/562* (2013.01); *H01L 21/7682* (2013.01); *H01L 23/4821* (2013.01); *H01L 23/66* (2013.01); *H01L 2223/6683* (2013.01)

(58) Field of Classification Search
None
See application file for complete search history.

(56) References Cited

U.S. PATENT DOCUMENTS

| 4,456,888 | A | 6/1984 | Ayasli |
| 7,335,931 | B2 | 2/2008 | Alm |
| 8,178,391 | B2 | 5/2012 | Davis et al. |
| 2003/0011008 | A1* | 1/2003 | Nelson ............... H01L 27/088 257/275 |
| 2008/0311682 | A1* | 12/2008 | Adlerstein ........... H01L 23/552 438/3 |
| 2012/0182066 | A1 | 7/2012 | Merkle et al. |
| 2013/0208434 | A1 | 8/2013 | Alm |

OTHER PUBLICATIONS

P. Kurpas et al.; "BCB Encapsulation for High Power AlGaN/GaN-HFET Technology;" CS Mantech Conference, May 13-16, 2013, New Orleans; 4 pages.

* cited by examiner

*Primary Examiner* — Khaja Ahmad
(74) *Attorney, Agent, or Firm* — Daly, Crowley, Mofford & Durkee, LLP

(57) ABSTRACT

A substrate having an air bridge structure with end portions disposed and supported on the substrate and an elevated portion disposed between the end portions is coated with a protective layer. The protective layer is patterned to: leave portions of the protective layer over elevated portion and at least over the end portions of a region under the elevated portion of the air bridge structure; and remove portions over adjacent portions of the substrate. A dielectric material having a thickness greater than the height of the air bridge structure is deposited over the patterned protective layer portions remaining over elevated portion and over the adjacent portions of the substrate, the patterned temporary coating preventing the dielectric material from passing into the region under the elevated portion of the air bridge structure. The dielectric material is patterned to remove portions of the dielectric material over the patterned protective layer remaining over elevated portion while leaving the dielectric material over the adjacent portions of the substrate. The patterned protective layer portions remaining over elevated portion are removed while leaving the dielectric material over the adjacent portions of the substrate.

13 Claims, 11 Drawing Sheets

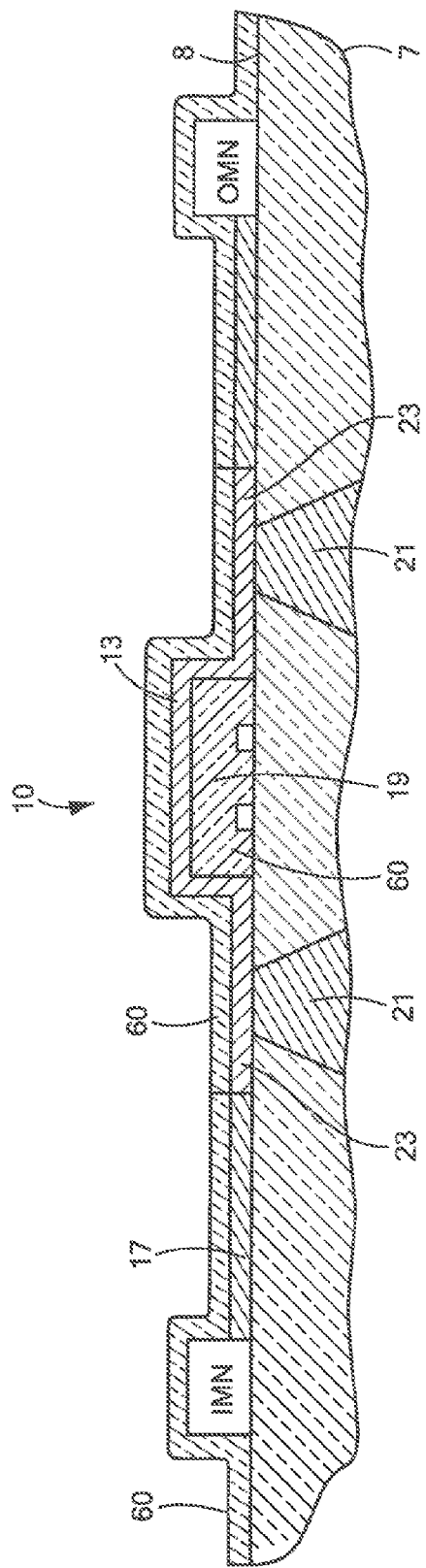
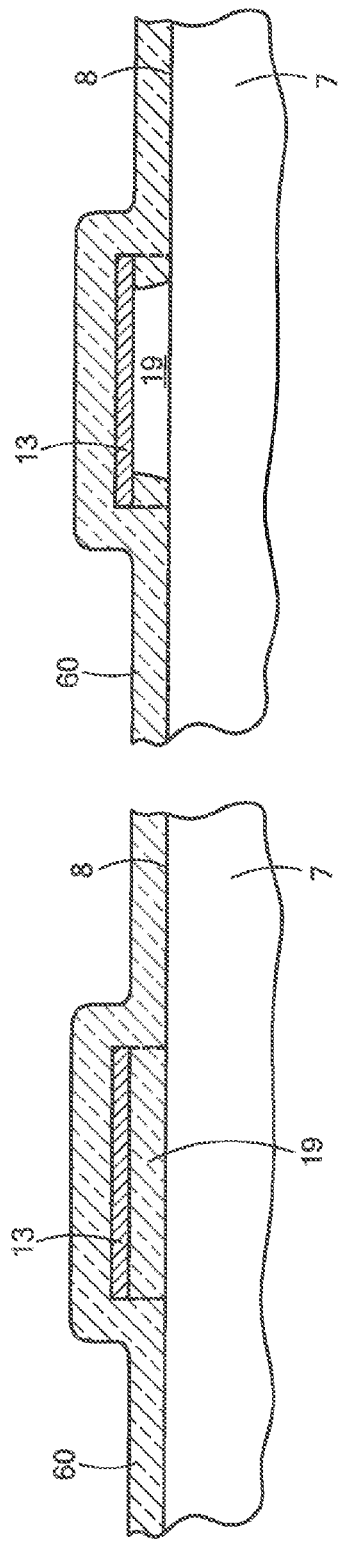
FIG. 4B
FIG. 4B'
FIG. 4B''

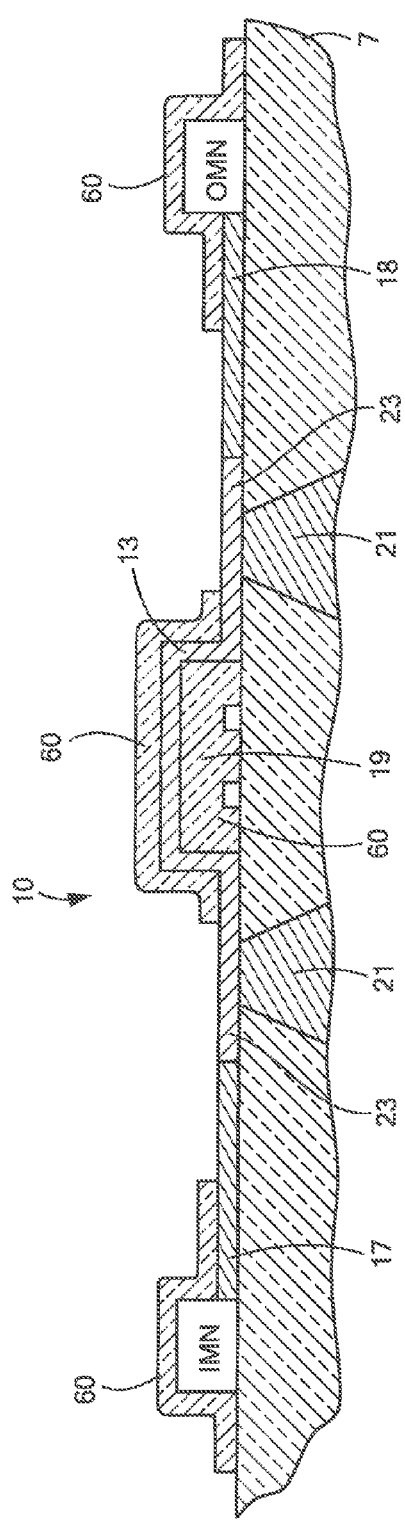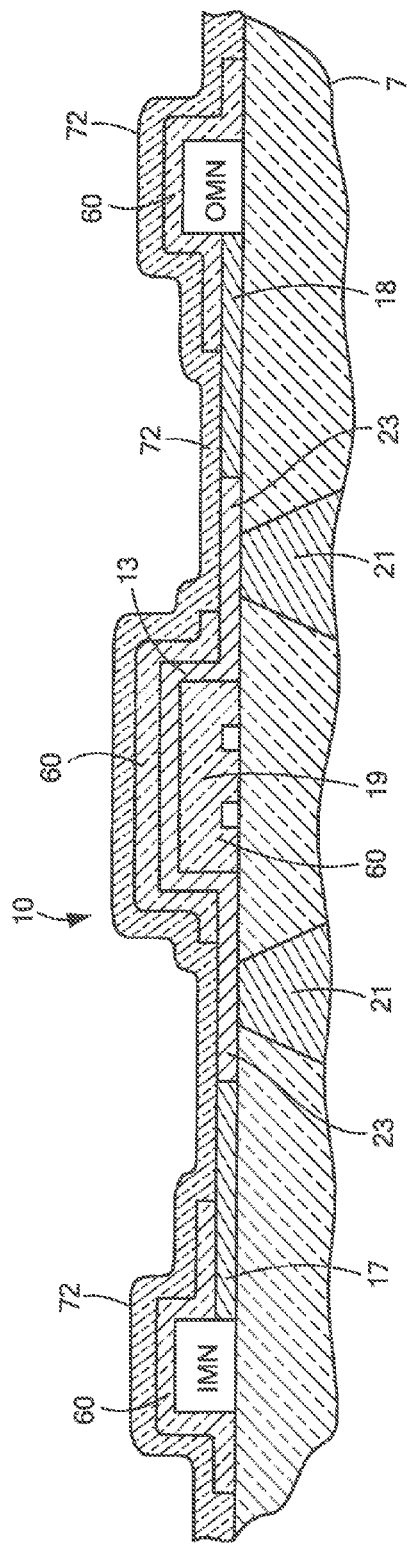

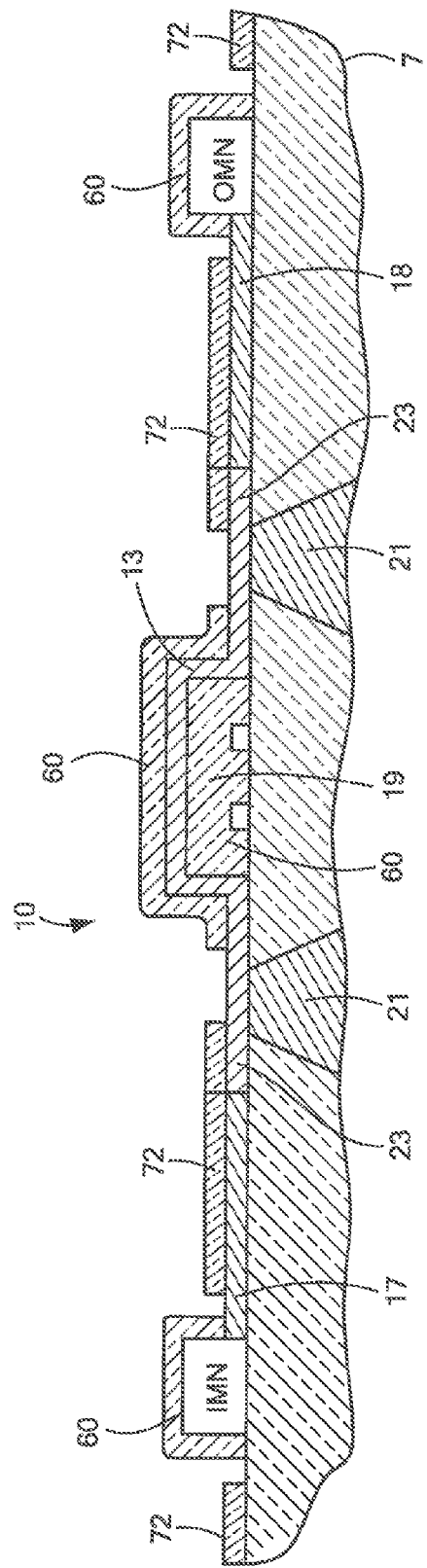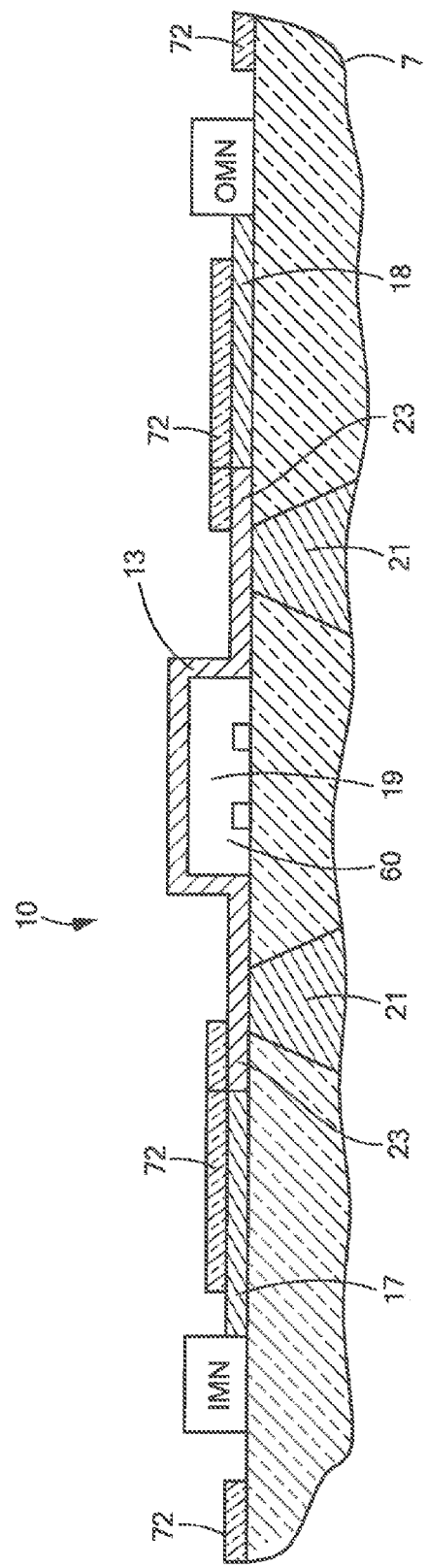

AIR BRIDGE STRUCTURE HAVING DIELECTRIC COATING

CROSS REFERENCE TO RELATED APPLICATION

This is a Divisional Application of application Ser. No. 14/086,105 filed Nov. 21, 2013 which application is hereby incorporated herein by reference in its entirety.

TECHNICAL FIELD

This disclosure relates generally to circuits having air bridge structures and more particularly to circuits having air bridge structures with dielectric coatings.

BACKGROUND

As is known in the art, it is frequently desirable to fabricate, and electrically interconnect, both passive and active microwave components on a common substrate. Such arrangement is commonly referred to as a monolithic microwave integrated circuit. Typically the components are electrically interconnected with microstrip or coplanar waveguide transmission lines.

As is also known in the art, a monolithic microwave integrated circuit (MMIC) includes a semiconductor substrate having formed on a surface thereof electrically active and passive devices electrically interconnected with microwave transmission lines as described in, for example, U.S. Pat. No. 6,545,563, issued Apr. 8, 2003, Inventor Irl W Smith; entitled "Digitally controlled monolithic microwave integrated circuits". Air-bridge structures are sometimes used in these MMICs. For example, many active devices are formed with inter-digitated electrodes. One such active device is described in U.S. Pat. No. 4,456,888, issued Jun. 26, 1984 and entitled "Radio Frequency Network Having Plural Electrically Interconnected Field Effect Transistor Cells", assigned to the same assignee as the present invention.

As is also known, dielectric and protective coatings are often applied to MMICs to prevent mechanical damage or deterioration of the circuit elements from environmental exposure. The coatings must have low dielectric constants in order to prevent loss of performance of the circuit.

The inventors have recognized that while these dielectric coating may be required to cover and thereby protect the passive devices and interconnection microwave transmission line, for active devices, such as the FETs which use air bridges to connect circuit elements together, it is often found that even low dielectric constant films cannot match the performance of air under the air bridges. This impact is greatest on active transistor elements where the change in parasitic capacitance due to the change in the dielectric constant between the gate and air bridge directly impacts circuit performance.

Previous methods for removing the dielectric coatings from these the air bridges, including the region below the air bridges, included the use of a negative photo-imageable coating where the film is unexposed in the air bridge region and subsequent removed by development. Alternatively the dielectric coating could be masked with an etch-resistant coating except for the air bridge regions and an etchant is used to remove dielectric film from the air bridge regions. Both of these approaches fail to completely remove the dielectric film from under the air bridge, and extending the developing of the photo-imageable layer, or the etch time of the etched layer causes dielectric film loss in the areas where the film is required. Etching of the dielectric coating can also lead to undesirable removal of other inorganic dielectric coatings such as oxides and nitrides which can cause changes in the performance of the circuit.

SUMMARY

In accordance with the present disclosure, a structure is provided having: a substrate; passive electrical circuits disposed on a surface of the substrate; a transistor device disposed on the surface of the substrate; and transmission lines disposed on the substrate connecting the passive electric circuits to the transistor device. The transistor device comprises an electrically conductive air bridge structure, the air bridge structure being elevated from an underlying portion of the surface of the substrate. A solid dielectric layer is disposed on passive electrical circuits and on the transmission lines, the solid dielectric layer having a thickness greater than a height of a region between said underlying portion of the surface of the substrate and a bottom surface of the air bridge, the solid dielectric layer being absent from an upper surface of the elevated portion of the air bridge structure and totally absent from said region between said underlying portion of the surface of the substrate and said lower surface of the elevated portion of the air bridge structure.

In one embodiment, a method is provided for forming an air bridge. The method includes providing a substrate having an air bridge structure with end portions disposed and supported on the substrate and an elevated portion disposed between the end portions is coated with a protective layer. The protective layer is patterned to: leave portions of the protective layer over elevated portion and at least over the end portions of a region under the elevated portion of the air bridge structure; and remove portions over adjacent portions of the substrate. A dielectric material is deposited over the patterned protective layer portions remaining over elevated portion and over the adjacent portions of the substrate, the patterned temporary coating preventing the dielectric material from passing into the region under the elevated portion of the air bridge structure. The dielectric material is patterned to remove portions of the dielectric material over the patterned protective layer remaining over elevated portion while leaving the dielectric material over the adjacent portions of the substrate. The patterned protective layer portions remaining over elevated portion are removed while leaving the dielectric material over the adjacent portions of the substrate.

In one embodiment, the substrate has formed on a surface thereof electrically interconnected a transistor device and passive devices. The transistor device includes: an active region; a pair of electrodes and a control electrode, the control electrode controlling a flow of carriers through the active region between the pair of electrodes, and a metal air bridge structure having end portions electrically connected to one of electrodes, the metal air bridge structure having an elevated portion disposed between the end, the elevated portion being suspended over an underlying portion of the active region. The transistor device and passive devices are coated with a temporary protective layer. The temporary protective layer is patterned to: (A) leave portions of the temporary protective layer over elevated portion of the air bridge structure and at least over the end portions of a region under the elevated portion of the air bridge structure; and (B) remove portions of the temporary protective layer over the passive devices. A dielectric material is deposited over the patterned temporary protective layer portions remaining over elevated portion of the air bridge structure and over the passive devices. The dielectric material is patterned to remove portions of the dielectric material over the patterned temporary protective layer remaining over elevated portion of the air bridge structure while leaving the dielectric material over the passive devices. The patterned temporary protective layer portions remaining over elevated portion of the air bridge structure are removed while leaving the dielectric material over the passive devices.

In one embodiment, the temporary protective layer prevents the dielectric material from passing under the elevated portion of the air bridge structure during the depositing of the dielectric material.

In one embodiment, the dielectric material comprises Benzocyclobutene.

Selective coating of the dielectric material is achieved by the application of a temporary or sacrificial coating (the above-mentioned temporary protective layer) over and under the air bridge structure and at least over the end portions of a region under the elevated portion of the air bridge structure, which prevents the dielectric coating from filling the protected region. The temporary fill layer can be removed after completion of the patterning of the dielectric material with no loss of the dielectric film.

The temporary protective layer selected uses a different casting solvent and developer etch solution than the dielectric material. This enables high selectivity in the patterning and removal of the temporary protective layer after the final pattern of the dielectric material is formed. Because the air bridges form protective canopies for any coating which fills the cavity beneath the air bridges, very long develop or etch times are required to remove the temporary protective layer under the air bridges. This process utilizes a temporary protective layer which can be developed or etched in a solution for a period long enough to completely remove it from the cavity under the air bridge, while not causing any loss of the dielectric material. Thus, the disclosure selectively coats a low dielectric constant material on a wafer while simultaneously preserving the air under the air bridge.

The details of one or more embodiments of the disclosure are set forth in the accompanying drawings and the description below. Other features, objects, and advantages of the disclosure will be apparent from the description and drawings, and from the claims.

DESCRIPTION OF DRAWINGS

FIGS. 4A-4H are diagrammatical cross sectional diagrams of a method of coating the MMIC structure having the FET of FIG. 1 with a dielectric material in accordance with the disclosure;

FIGS. 4A' and 4B' and 4B" are diagrammatical cross sectional diagrams of a method of coating the MMIC structure having the FET of FIG. 1 with a dielectric material in accordance with the disclosure.

Like reference symbols in the various drawings indicate like elements.

DETAILED DESCRIPTION

Figure 5A:
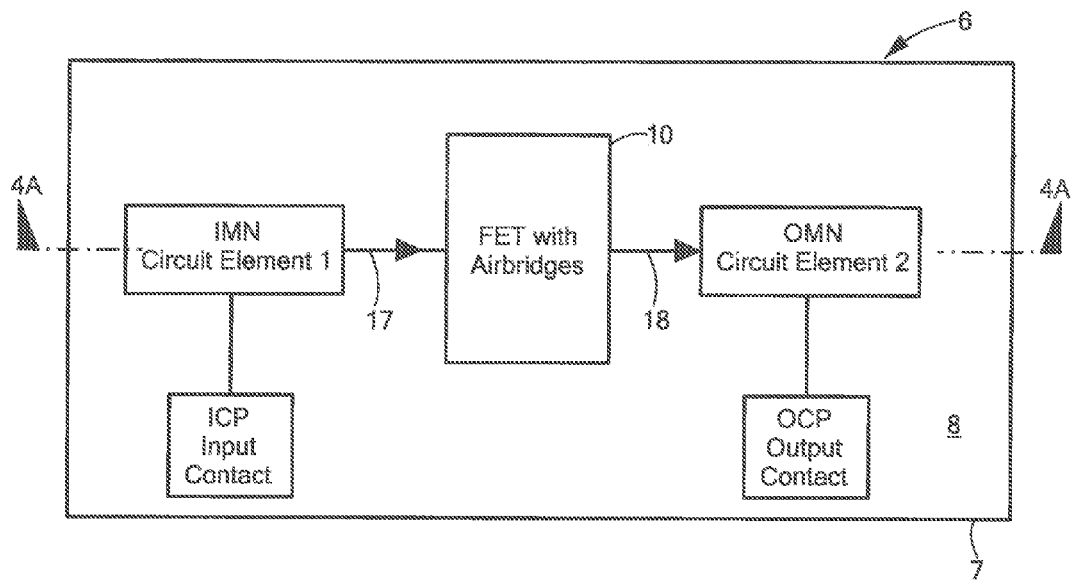
FIGS. 5A-5H are diagrammatical plan view diagrams of a method of coating the MMIC structure having the FET of FIG. 1 with a dielectric material in accordance with the disclosure; the cross sectional view of FIGS. 4A and 4A' being taken along line-4A-4A and line 4A'-4A', respectively, in FIG. 5A.

Referring now to FIG. 5A, a MMIC 6 is provided having a substrate 7 having formed on an upper surface 8 thereof an electrically interconnected: active device, here for example, a transistor device 10; and passive circuits including: input impedance matching network IMN, here for example, inductors and capacitors arranged in any conventional manner; output impedance matching circuit OMN, here for example, inductors and capacitors arranged in any conventional manner; an input contact pad ICP; and an output contact pad OCP, all electrically interconnected, as shown, with microwave transmission lines 17, 18.

Figure 1:
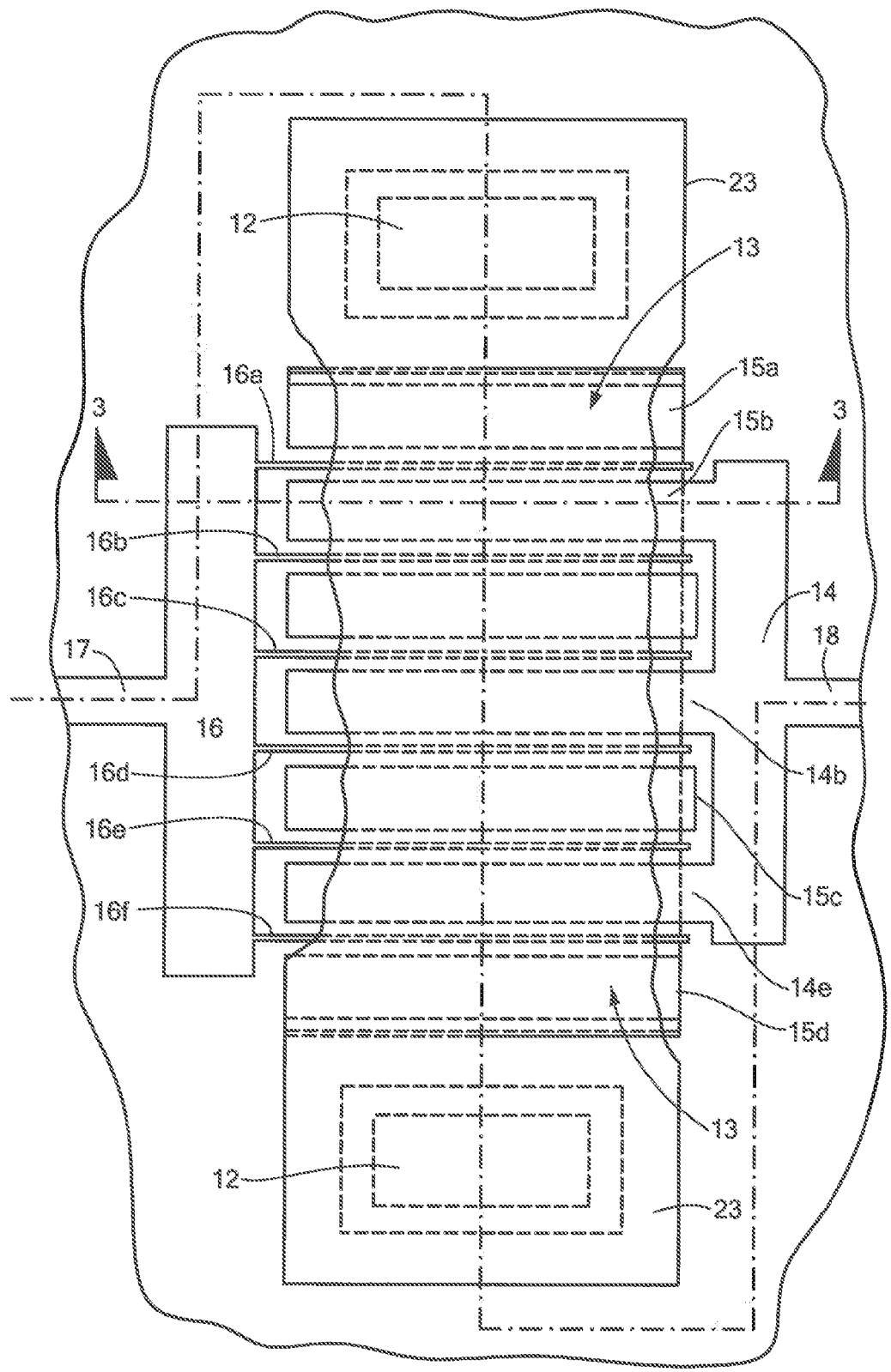
FIG. 1 is a diagrammatical plan view of an active device, here a field effect transistor (FET) having an air bridge structure at one stage in the method according to the disclosure.
Figure 2:
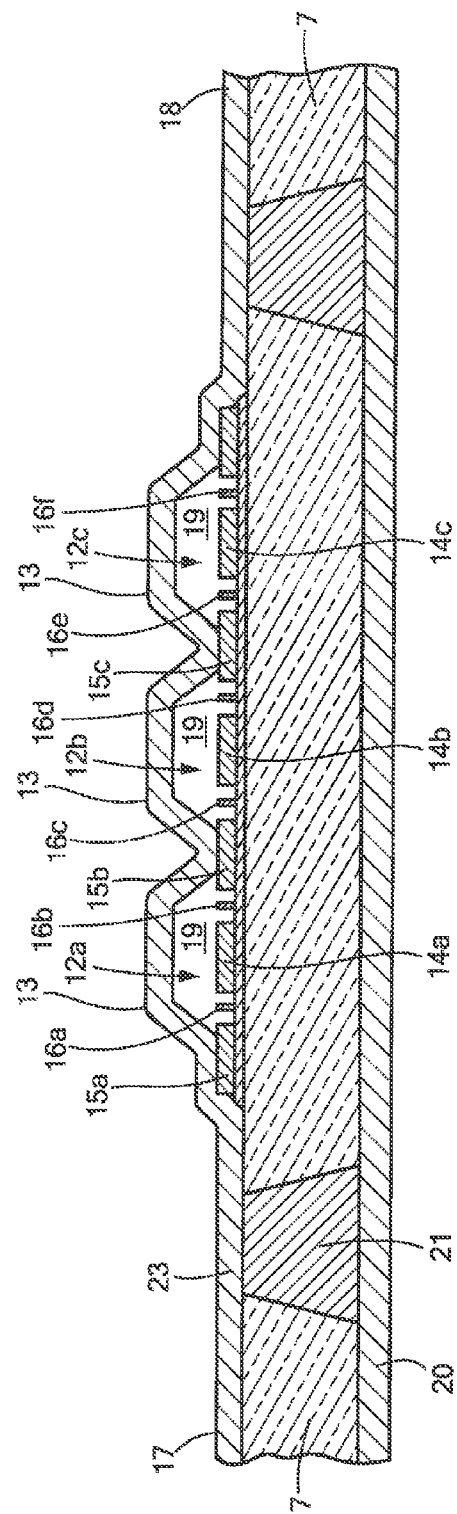
FIG. 2 is a cross-sectional view of the (FET) of FIG. 1 such section being taken along line 2-2 of FIG. 1.
Figure 3:
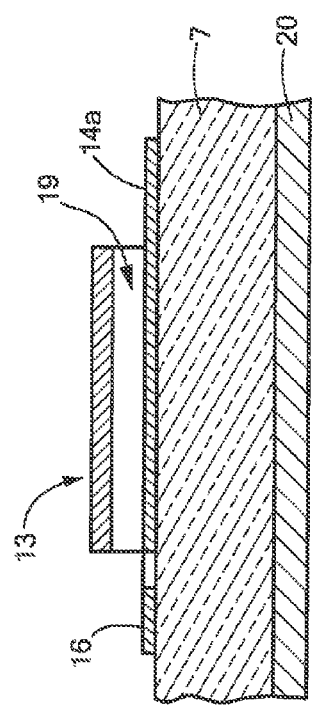
FIG. 3 is a cross-sectional view of the FET of FIG. 1, such section being taken along line 3-3 of FIG. 1.

Referring now to FIGS. 1, 2 and 3, the transistor 10 is shown in more detail to include, for purposes of illustration, a plurality of, here three, field effect transistor cells 12a-12c, and a coupling means, here an air bridge structure 13, shown most clearly in FIG. 3, for electrically interconnecting a like one of the source electrodes 14a-14c, drain electrodes 15a-15d and gate electrodes 16a-16f, here for electrically interconnecting the drain electrodes 15a-15d, as shown. It is noted that the air bridge structure 13 makes contact with the drain electrodes 15a-15d (FIG. 2) and is elevated over the gate electrodes 16a-16f, and source electrodes 14a-14c, as shown in FIG. 2 and also FIG. 3 for source electrode 14a by air regions 19, as shown. Thus, the air region 19 is disposed between a lower surface of the air bridge structure 13 and an underlying surface portion of the substrate 7.

The gate electrodes 16a-16f are electrically interconnected by a common gate pad 16, as shown most clearly in FIG. 1. Likewise, the source electrodes 14a-14c are electrically interconnected by a common source pad 14, as shown most clearly in FIG. 1. The drain electrodes 15a-15d are interconnected by the air bridge structure 13. The ends 23 (FIGS. 1 and 3) of the air bridge structure 13 are connected to a ground plane conductor 20 formed on the bottom surface of the substrate 7, as shown in FIGS. 2 and 3, through conductive vias 21, as shown most clearly in FIG. 2. The input and output transmission lines 17, 18 (FIGS. 5A, 2 and 3) are here a pair of microstrip transmission line circuits.

Referring now to FIGS. 4A-4H, and FIGS. 5A-5I the process for coating the MIMIC 6 having electrically interconnected: transistor device 10 (FIGS. 1, 2 and 3, here being shown in a more simplified diagrammatical sketch format); input impedance matching network IMN; output impedance matching circuit OMN; an input contact pad ICP; and an output contact pad OCP, all electrically interconnected, as shown, with microwave transmission lines 17, 18 will be described here using simplified diagrammatical, cross sectional sketches.

Figure 4A:
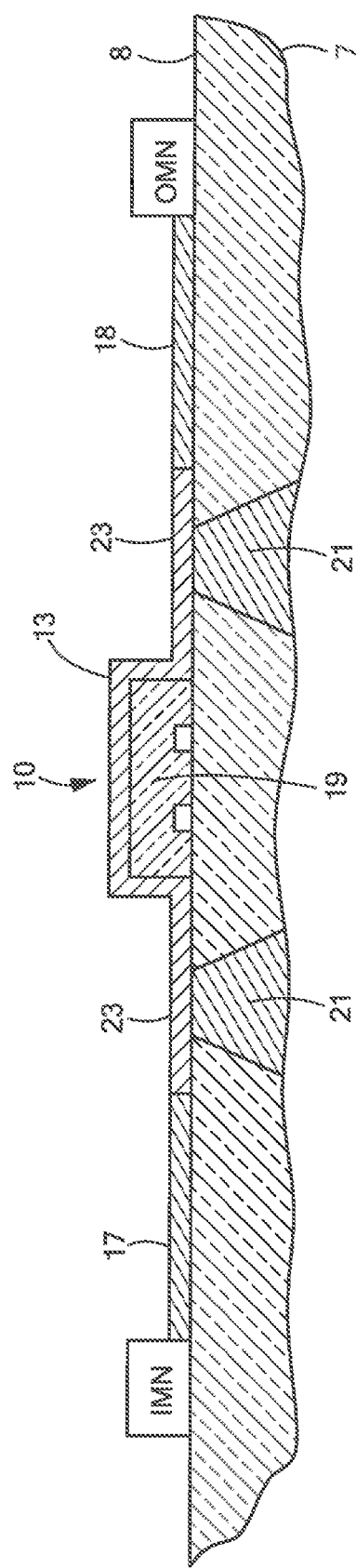
Figure 4A:
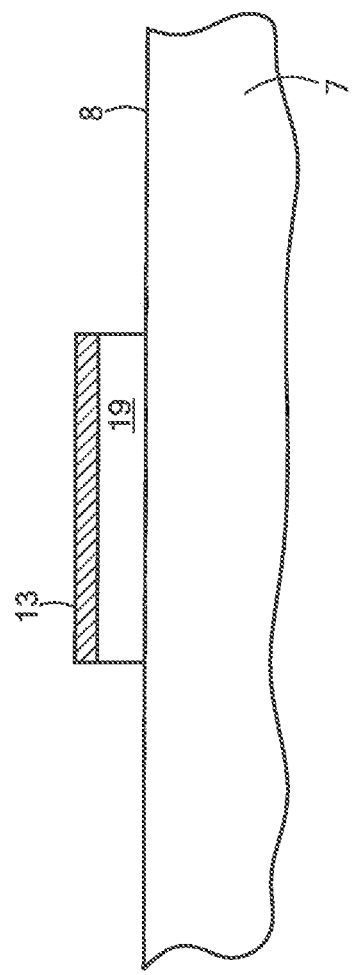
Figure 4C:
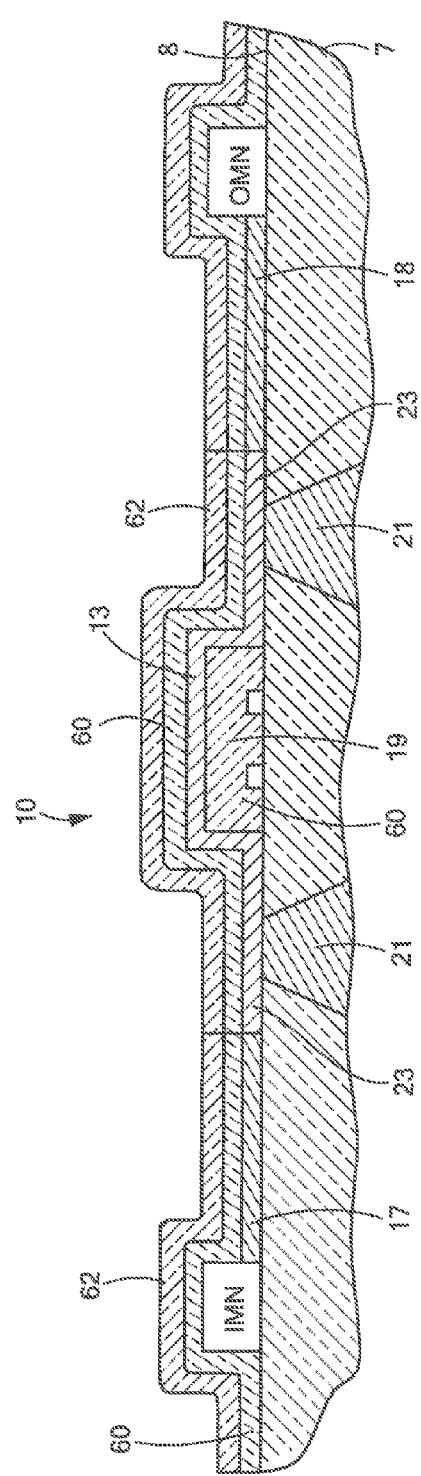
Figure 5B:
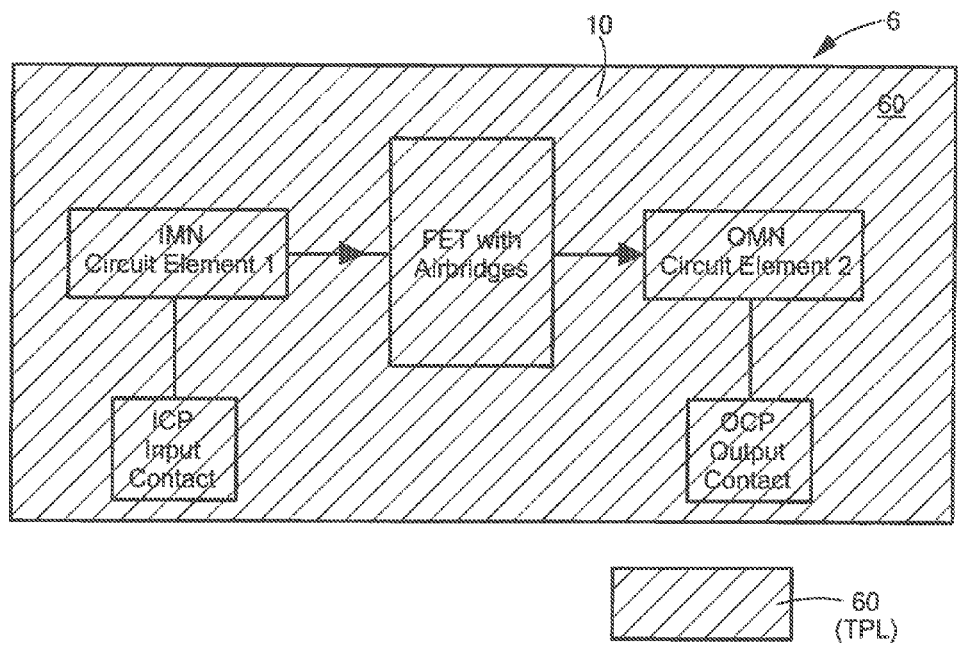
Figure 5C:
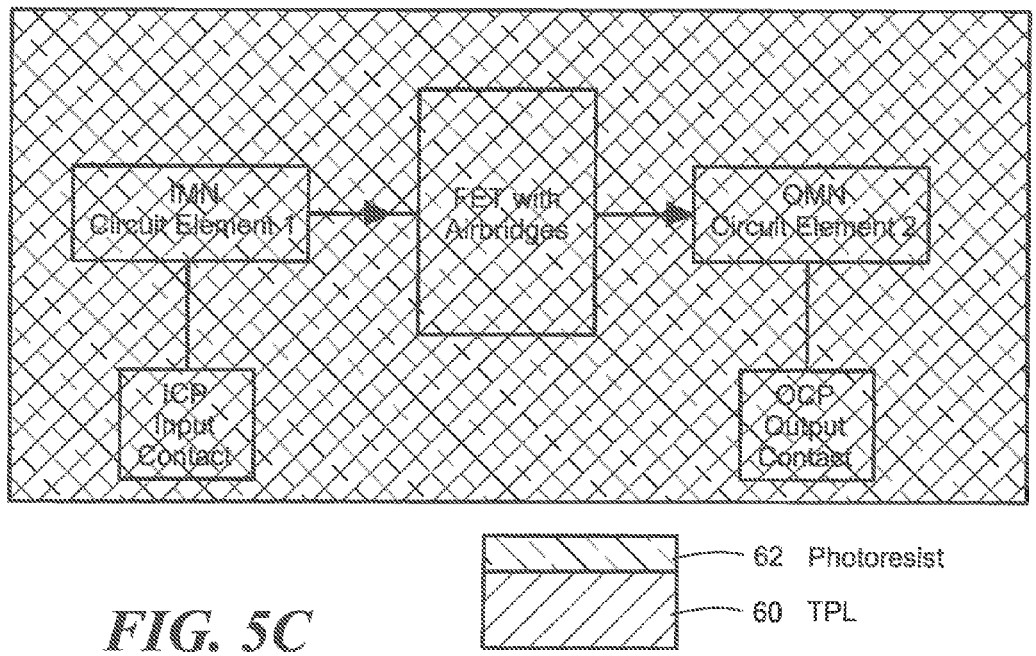

More particularly, referring first to FIGS. 4B and 5B, the entire upper surface 8 of the substrate 7 is coated with a temporary protective layer (TPL) 60, here for example, Polymethylglutarimide (PMGI) Resists as shown in FIGS. 4A, 4A' and 5A, where FIG. 5A is a diagrammatical plan view of the MMIC 6; the temporary protective layer 60 being indicated in FIG. 5B by the cross hashing indicated in the designation box or legend 61 (FIG. 5B). More particularly, as shown in FIG. 5B, the temporary protective layer 60 is coated over the transistor device 10; the input impedance matching network IMN, the output impedance matching circuit OMN, the input contact pad ICP; the output contact pad OCP, and the microwave transmission lines 17, 18. It is noted in FIG. 4A', that the temporary protective layer (TLP) 60 flows either under the entire air bridge structure 13, as shown most clearly in FIG. 4B' or partially under the air bridge 13 as shown most clearly in FIG. 5B", and therefore at least partially into the air filled region 19, as shown most clearly in FIGS. 4B' and 4B" depending on the viscosity of the material used for the temporary protective layer 60. One key property is that protective layer 60 material have the ability to be remove it even if it were to completely fill under the air bridge structure 13 (region 19, FIG. 4A, 4B'), without having any impact on a patterned BCB dielectric layer (to be described). In any event, the coating of the temporary protective layer 60 also leaves portions of the temporary protective layer 60 over elevated portion of the air bridge structure 13 and at least on the sides and typically under at least the end portions of the region 19 (FIGS. 4B') under the air bridge structure 13; thus, as noted above, the temporary protective layer 60 flows under at least peripheral outer regions of the air bridge structure 13. As will be described the temporary protective layer 60 prevents any of the BCB dielectric material, to be described, from passing into the region 19 under the elevated portion of the air bridge structure.

Next, the temporary protective layer 60 is patterned, here using photolithography, for example, to: leave portions of the temporary protective layer 60 over elevated portion of the air bridge structure 11 and at least on the sides and typically under at least the end portions (FIGS. 5B-5E) of the region 19 (FIGS. 4C-4E) under the air bridge structure 13; and remove portions of the temporary protective layer 60 over the passive devices; e.g., the input impedance matching network IMN, the output impedance matching circuit OMN and the microwave transmission lines 17, 18.

Figure 4D:
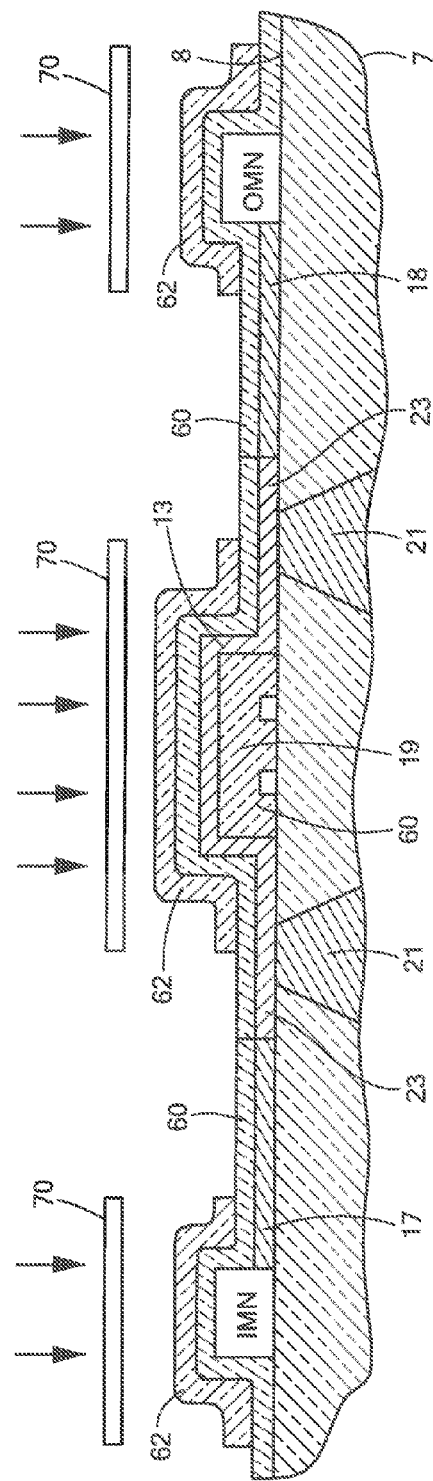
Figure 5D:
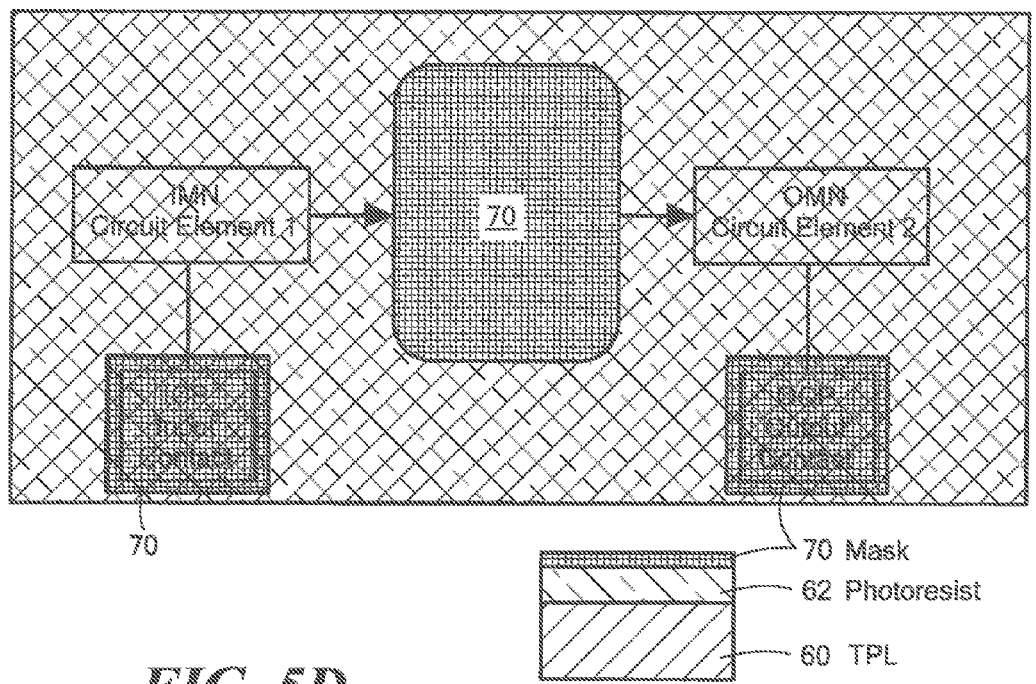
Figure 5E:
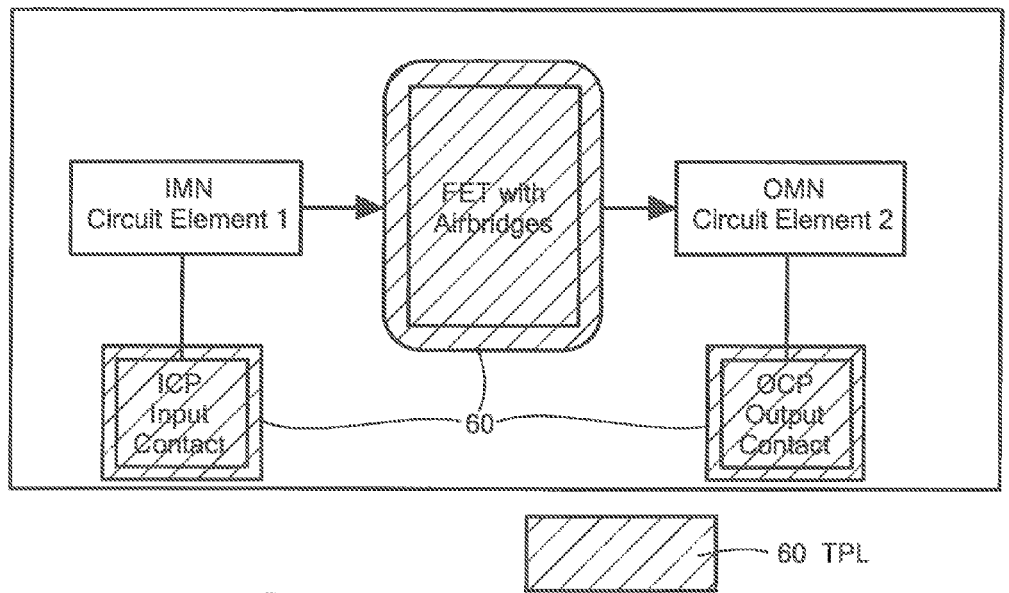
Figure 5F:
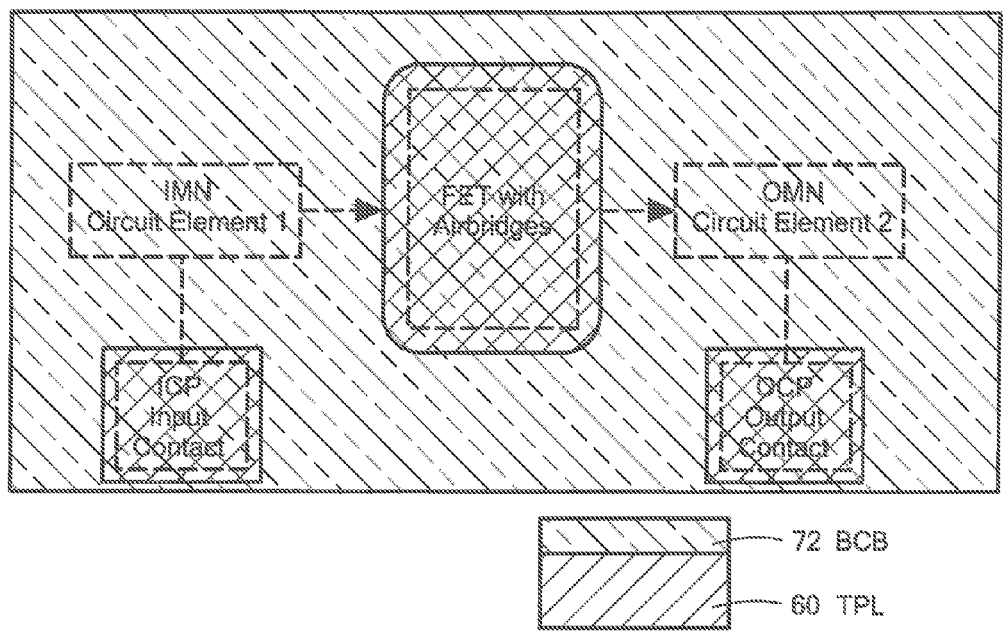

More particularly, here, for example, the upper surface of the temporary protective coating 60 is covered with photoresist 62 (FIGS. 4C and FIG. 5C), and then the portions of the photoresist layer 62 over the air bridge structure 13 are covered with a mask 70 (FIGS. 4D and 5D). The surface is then exposed to light, the photoresist layer 62 is then developed and then etched to produce the patterned photoresist layer 62 (FIG. 4E) with portions of the temporary protective layer 60 remaining over elevated portion of the air bridge structure 13 and at least on the sides and typically under at least the end portions (FIGS. 5B-5E) of the region 19 (FIGS. 4C-4E) under the air bridge structure 13 while removing portions of the temporary protective layer 60 remaining over the passive devices; e.g., the input impedance matching network IMN, the output impedance matching circuit OMN, the input contact pad ICP; the output contact pad OCP, and the microwave transmission lines 17, 18 additionally leaving the temporary protective layer 60 over the input contact pad (ICP) and the output contact pad (OCP) and then the photoresist layer 62 is removed (FIGS. 4E and 5E).

Next, a solid dielectric material or layer 72, (FIGS. 4F and 5F) here, for example, a layer or film of Benzocyclobutene (BCE) is deposited, here spin coated, over the surface of the structure including: over the patterned temporary protective layer 60 portions remaining over: elevated portion of the air bridge structure 11 and remaining under at least the end portions 63 of the region 19 under the air bridge structure 13; and over the passive devices, e.g., the input impedance matching network IMN, the output impedance matching circuit OMN, the input contact pad ICP; the output contact pad OCP, and the microwave transmission lines 17, 18. It is first noted that the thickness of the BCE dielectric layer is greater than the height of the air bridge structure 13 (more particularly, thicker that the height of region 19 between the upper surface 8 of the substrate 7 and the lower surface of the air bridge structure 13). It is next noted however that the temporary protective layer 60 portions remaining over elevated portion of the air bridge structure 13 and under at least the end portions 63 of the region 19 under the air bridge structure 13 thereby preventing the thick BCE dielectric material 72 from flowing under the air filled region 19 under the air bridge structure 13.

Figure 5G:
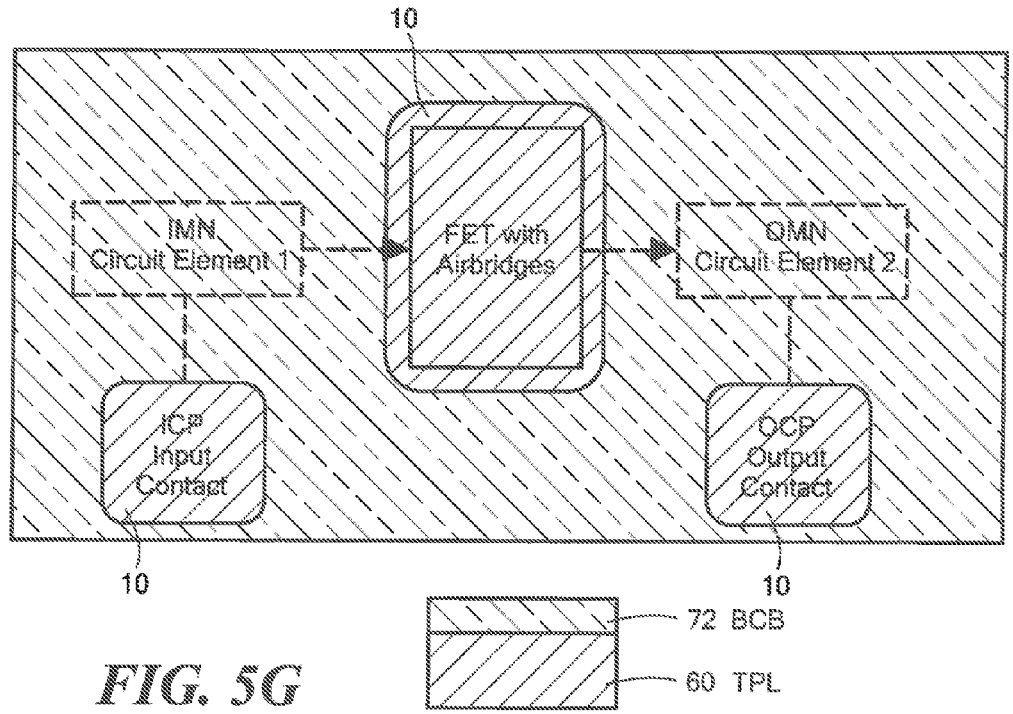

Next, the BCB dielectric layer 72 is patterned using conventional photolithographically (e.g., masked and etched) to remove portions of the dielectric layer 72 over the patterned temporary protective layer 60 remaining over elevated portion of the air bridge structure 13 while leaving the BCB dielectric material 72 over the passive devices, e.g., the input impedance matching network IMN, the output impedance matching circuit OMN, the input contact pad ICP; the output contact pad OCP, and the microwave transmission lines 17, 18, as shown in FIGS. 4G and 5G.

Figure 5H:
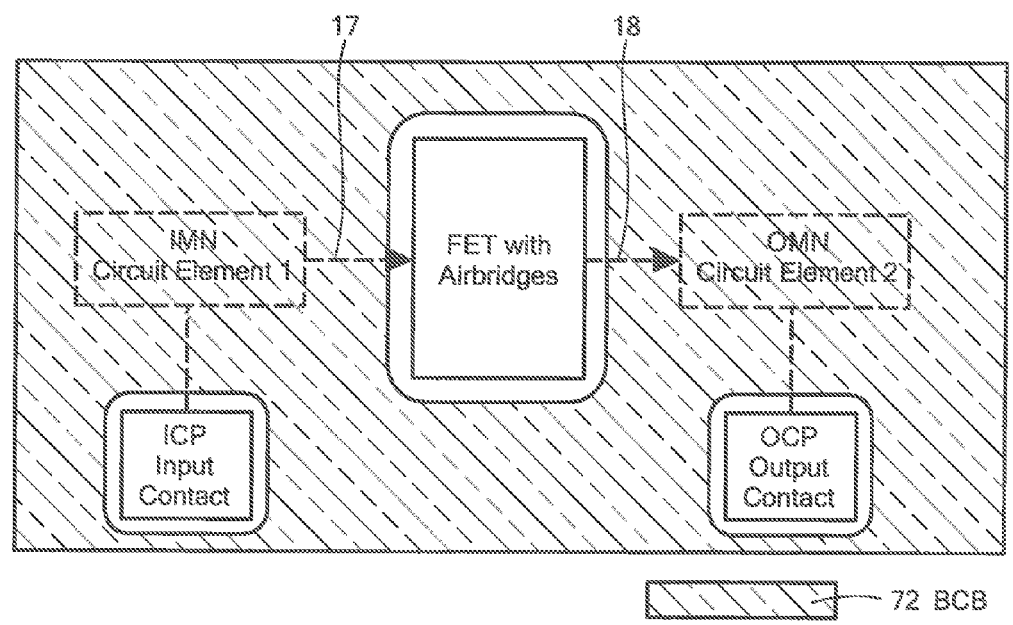

Next, referring to FIGS. 4H and 5H, the remaining patterned temporary protective layer 60 is removed, here, for example, using with D2100 developer by Dow Chemical. Thus, the patterned temporary protective layer 60 is removed from portions remaining over elevated portion of the air bridge structure 11 and at least peripheral outer regions 63 of the air bridge structure 13 of the region 19 and under the air bridge structure 13 (region 19), while leaving the dielectric material 72 over the passive devices, e.g., the input impedance matching network IMN, the output impedance matching circuit OMN, the input contact pad ICP; the output contact pad OCP, and the microwave transmission lines 11 (FIG. 4H, 5H). Thus, it is noted that the temporary protective layer 60 has prevented any BCB dielectric material 72 from entering the entire air filled region 19 and consequently the solid dielectric material or layer 72, is totally absent from the air filled region 19 between said underlying portion of the surface of the substrate 7 and said lower surface of the elevated portion of the air bridge structure 13.

Finally, the BCB dielectric layer 72 is patterned using conventional photolithography, the open areas over the input and output contact pads (ICP, OCP), as shown in FIG. 5I.

A number of embodiments of the disclosure have been described. Nevertheless, it will be understood that various modifications may be made without departing from the spirit and scope of the disclosure. Accordingly, other embodiments are within the scope of the following claims.

What is claimed is:

1. A method for forming an air bridge, comprising:
providing a structure comprising a substrate having a metal air bridge structure, the metal air bridge structure having end portions disposed and supported on the substrate and an elevated portion of the metal air bridge structure disposed between the end portions and suspended over the substrate;
coating the provided structure with a temporary protective layer;
patterning the temporary protective layer to leave portions of the temporary protective layer over the elevated portion of the metal air bridge structure and at least over the end portions of a region under the elevated portion of the metal air bridge structure while removing portions of the temporary protective layer over adjacent portions of the substrate;
depositing a dielectric material over the patterned temporary protective layer portions remaining over the elevated portion of the metal air bridge structure and over the adjacent portions of the substrate;
patterning the dielectric material to remove portions of the dielectric material over the patterned temporary protective layer remaining over the elevated portion of the metal air bridge structure while leaving the dielectric material over the adjacent portions of the substrate;

removing the patterned temporary protective layer portions remaining over the elevated portion of the metal air bridge structure and over the region under the elevated portion of the metal air bridge structure while leaving the dielectric material over the adjacent portions of the substrate.

2. The method recited in claim 1 wherein the patterned temporary coating prevents the dielectric material from passing into the region under the elevated portion of the metal air bridge structure.

3. The method recited in claim 2 wherein the dielectric material comprises Benzocyclobutene.

4. A method for forming a semiconductor structure, comprising:
(A) providing a substrate having thereon:
passive electrical circuits disposed on a surface of the substrate;
a transistor device disposed on the surface of the substrate;
transmission lines disposed on the substrate connecting the passive electric circuits to the transistor device;
wherein the transistor device comprises an electrically conductive air bridge structure connected between the transmission lines and elevated from an underlying portion of the surface of the substrate;
(B) coating the provided substrate with a temporary protective layer;
(C) patterning the temporary protective layer to leave portions of the temporary protective layer over an upper surface of the electrically conductive air bridge structure and a region between a lower surface of the elevated portion of the electrically conductive air bridge structure and the underlying portion of the surface of the substrate while removing portions of the temporary protective layer over the passive devices and transmission lines;
(D) depositing a dielectric material over the patterned temporary protective layer, the patterned temporary coating preventing the dielectric material from passing into the region between the lower surface of the elevated portion of the electrically conductive air bridge structure and the underlying portion of the surface of the substrate;
(E) patterning the deposited dielectric material to expose the upper surface of the electrically conductive air bridge structure;
(F) removing the patterned temporary protective layer including the portions of the temporary protective layer over an upper surface of the electrically conductive air bridge structure and in the region between the lower surface of the elevated portion of the electrically conductive air bridge structure and the underlying portion of the surface of the substrate.

5. The method recited in claim 4 wherein the substrate includes the transistor device having the electrically conductive air bridge structure.

6. The method recited in claim 5 wherein the transistor device includes:
an active region;
a pair of electrodes and a control electrode, the control electrode controlling a flow of carriers through the active region between the pair of electrodes, and
wherein the electrically conductive air bridge structure has end portions electrically connected to one of the pair of electrodes, the electrically conductive air bridge structure having the elevated portion disposed between the ends, the elevated portion being suspended over an underlying portion of the active region.

7. The method recited in claim 4 wherein the dielectric material comprises Benzocyclobutene.

8. A method for forming a semiconductor structure, comprising:
providing a substrate having an electric circuit formed on a surface thereof,
the electrical circuit comprising electrically interconnected a transistor device, passive devices,
and a contact pad for the electrical circuit;
wherein the transistor device includes:
an active region;
a pair of electrodes and a control electrode, the control electrode controlling a flow of carriers through the active region between the pair of electrodes, and a metal air bridge structure having end portions electrically connected to one of electrodes, the metal air bridge structure having an elevated portion disposed between the end, the elevated portion being suspended over an underlying portion of the active region;
coating the transistor device, the passive devices and the contact pad with a temporary protective layer;
patterning the temporary protective layer to:
(A) leave portions of the temporary protective layer over the elevated portion of the air bridge and at least over the end portions of a region under the elevated portion of the metal air bridge structure; and
(B) remove portions of the temporary protective layer over the passive devices and the contact pad;
depositing a dielectric material over the patterned temporary protective layer portions remaining over the elevated portion of the metal air bridge structure, over the contact pad, and over the passive devices;
patterning the dielectric material to remove portions of the dielectric material over the patterned temporary protective layer remaining over the elevated portion of the metal air bridge structure while leaving the dielectric material over the passive devices;
removing the patterned temporary protective layer portions remaining over the elevated portion of the metal air bridge structure while leaving the dielectric material over the passive devices.

9. The method recited in claim 8 wherein the transistor device, the passive devices and the contact pad are electrically interconnected with transmission lines and wherein the temporary protective layer coating includes coating over the transmission lines; the patterning of the temporary protective coatings includes removing portions of the temporary protective layer over the transmission lines; the dielectric material depositing includes depositing the material over the transmission lines; and the removing of the patterned temporary includes leaving the dielectric material over the passive devices.

10. The method recited in claim 8 wherein the temporary protective layer prevents the dielectric material from passing under the elevated portion of the metal air bridge structure during the depositing of the dielectric material.

11. The method recited in claim 8 wherein the transistor device, the passive devices and the contact pad are electrically interconnected with transmission lines and wherein the temporary protective layer coating includes coating over the transmission lines; the patterning of the temporary protective coatings includes removing portions of the temporary protective layer over the transmission lines; the dielectric material depositing includes depositing the material over the transmission lines; and the removing of the patterned temporary includes leaving the dielectric material over the passive devices.

12. The method recited in claim 11 wherein the temporary protective layer prevents the dielectric material from passing under the elevated portion of the air bridge structure during the depositing of the dielectric material.

13. The method recited in claim 12 wherein the dielectric material comprises Benzocyclobutene.

\* \* \* \* \*